US008549368B1

(12) United States Patent
Deogharia et al.

(10) Patent No.: US 8,549,368 B1

(45) Date of Patent: Oct. 1, 2013

(54) MEMORY BUILT-IN-SELF TESTING IN MULTI-CORE INTEGRATED CIRCUIT

(75) Inventors: Amar Nath Deogharia, Noida (IN); Ankush Srivastava, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 32 days.

(21) Appl. No.: 13/475,948

(22) Filed: May 19, 2012

(51) Int. Cl.
*G01R 31/28* (2006.01)
*G06F 11/00* (2006.01)

(52) U.S. Cl.
USPC .............................. 714/727; 714/733; 714/30

(58) Field of Classification Search
USPC ................ 714/714, 727, 729, 733, 734, 741, 714/30, 33, 10, 11, 12
See application file for complete search history.

(56) References Cited

U.S. PATENT DOCUMENTS

| | | | | |
|---|---|---|---|---|
| 6,044,481 | A | 3/2000 | Kornachuk | |
| 6,142,683 | A * | 11/2000 | Madduri | 717/128 |
| 6,934,205 | B1 | 8/2005 | Pandey | |
| 7,398,440 | B2 * | 7/2008 | Warren | 714/724 |
| 7,665,002 | B1 * | 2/2010 | White et al. | 714/733 |
| 2013/0080748 | A1 * | 3/2013 | Moyer et al. | 712/227 |

* cited by examiner

*Primary Examiner* — Christine Tu

(74) *Attorney, Agent, or Firm* — Charles Bergere

(57) ABSTRACT

A multi-core integrated circuit includes first and second sets of processor cores and corresponding first and second test access ports (TAPs). The first and second TAPs are connected to corresponding first and second debug ports by way of corresponding first and second TAP controllers. The first and second sets of processor cores include first and second memory blocks and corresponding first and second built-in-self-testing (BIST) engines of different architectures. A control circuit configures the first and second TAP controllers and the connection between the first and second sets of processor cores and the first and second debug ports, for initiating the first and second BIST engines for testing the memory blocks using a predetermined test mode. A debug access module provides secure access to the first and second debug ports.

20 Claims, 2 Drawing Sheets

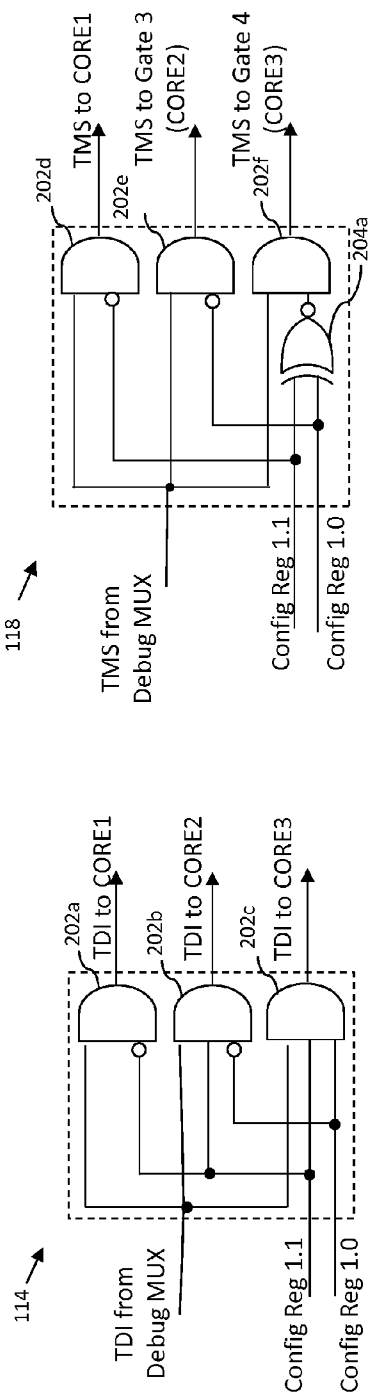
FIG. 4
FIG. 2
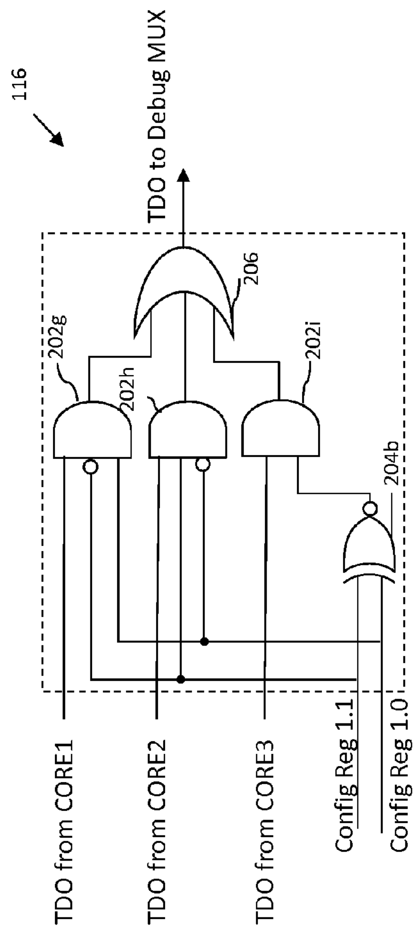
FIG. 3

MEMORY BUILT-IN-SELF TESTING IN MULTI-CORE INTEGRATED CIRCUIT

BACKGROUND OF THE INVENTION

The present invention relates to multi-core integrated circuits, and, more particularly, built-in-self-testing (BIST) circuitry for multi-core integrated circuits.

Multi-core integrated circuits (IC) include multiple processor cores that execute the same or different functions in cohesion. Certain multi-core ICs include two or more processor cores with each processor core executing a different function. Such multi-core ICs are known as heterogeneous multi-core ICs. For example, a heterogeneous multi-core IC may have a first processor core that is a general purpose processor and a second processor core that is a digital signal processor (DSP).

Processor cores in a heterogeneous multi-core IC execute different tasks or software programs simultaneously and temporarily store information in internal memory blocks. Each memory block has an associated BIST engine to test it for malfunctions. Different memory blocks may have BIST engines of different architectures. While testing the BIST engines, an external testing apparatus is connected to the IC by way of input and output (I/O) debug ports. The external testing apparatus includes a combination of hardware and/or software that tests the operation of a corresponding processor core. The external testing apparatus provides input data at the input debug port and based on the received input data, the BIST engines from selected processor cores are initiated and the corresponding memory blocks are tested. Upon completion, output test data is generated at the output debug port and provided to the external testing apparatus. The output test data is checked with the required specifications to determine whether there are any faults in any of the memory blocks.

Since it is necessary to test multiple memory blocks across multiple cores simultaneously, debug access to multiple BIST engines with different architectures is required. Further, each multiple core exhibits different operating characteristics and unauthenticated access to any of the multiple cores may cause damage to hardware and/or software elements of the core. Therefore, it is necessary to have secure debug access to the cores.

In addition, existing multi-core IC configurations require each BIST engine with a different architecture to be tested one at a time, which significantly increases test time. Multiple memory blocks with the same BIST architecture can be tested concurrently; however, testing multiple memory blocks with different BIST architectures is a time consuming and cumbersome task that significantly increases the overall memory testing time.

It would therefore be advantageous to have a test system for concurrently testing memory blocks with BIST engines of different architectures in a multi-core IC. It would further be advantageous to have a system for testing a multi-core IC that reduces test time and cost, provides secure access to multiple processor cores for testing, and eliminates the above mentioned shortcomings of existing test systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 2 is a schematic block diagram illustrating a TDI demux of the multi-core IC of FIG. 1, in accordance with an embodiment of the present invention;

FIG. 3 is a schematic block diagram illustrating a TDO mux of the multi-core IC of FIG. 1, in accordance with an embodiment of the present invention; and FIG. 4 is a schematic block diagram illustrating a TMS demux of the multi-core IC of FIG. 1, in accordance with an embodiment of the present invention.

DETAILED DESCRIPTION OF THE PRESENT INVENTION

Figure 1:
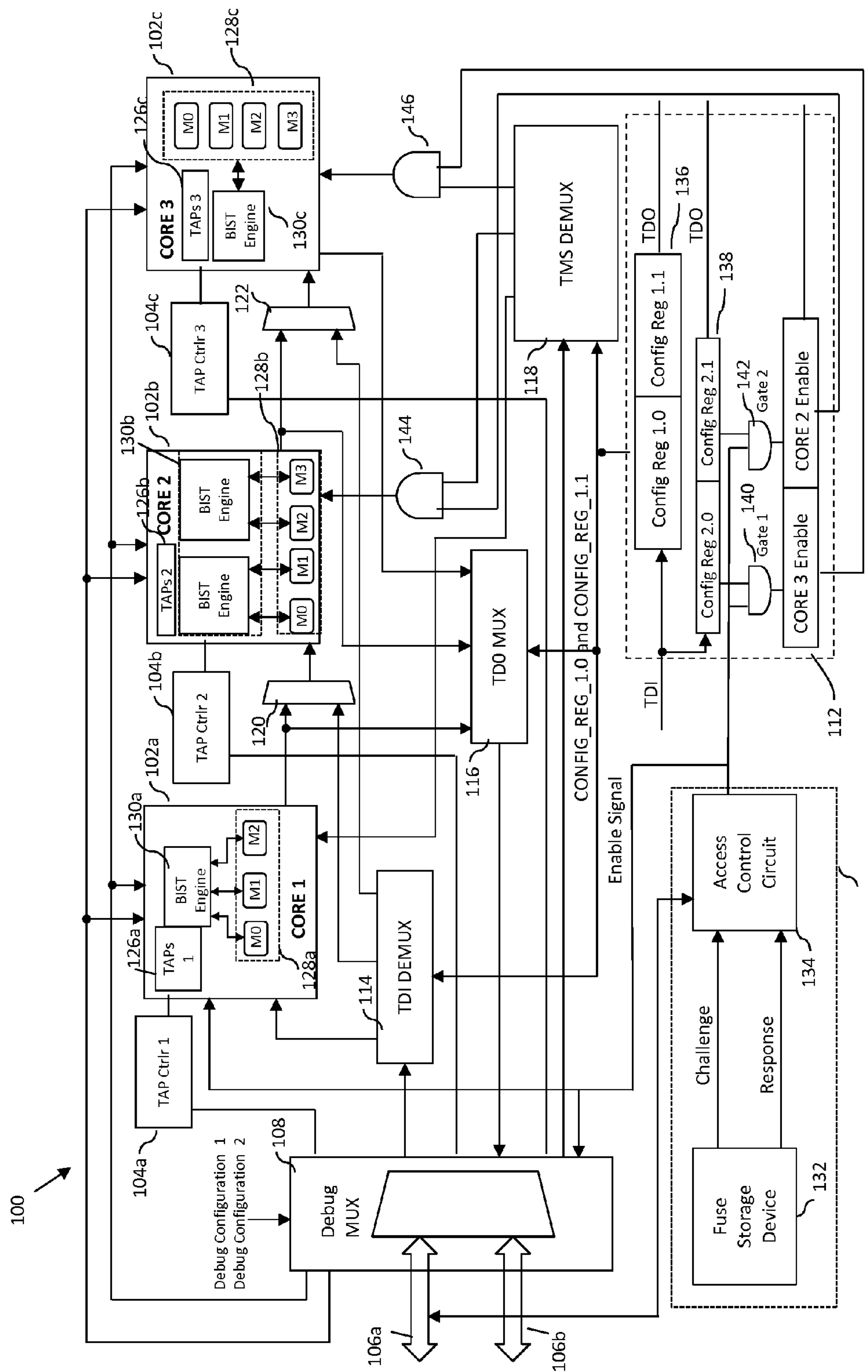
FIG. 1 is a schematic block diagram illustrating a multi-core integrated circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. In the description, the terms multiplexer and demultiplexer have been abbreviated as mux and demux, respectively.

In an embodiment of the present invention, a multi-core integrated circuit is provided. The multi-core integrated circuit includes a plurality of processor cores including first and second sets of processor cores. The first and second sets of processor cores include corresponding first and second sets of test access ports (TAPs), first and second sets of memory blocks, and first and second built-in-self-test (BIST) engines for testing the first and second sets of memory blocks respectively. First and second TAP controllers are connected to the first and second sets of processor cores respectively and connect the corresponding first and second sets of TAPs to corresponding first and second debug ports of the multi-core integrated circuit. A control circuit is connected between the first and second debug ports and the plurality of processor cores. The control circuit includes first and second configuration registers for receiving a configuration signal from at least one of the first and second debug ports. The first configuration register configures the first and second TAP controllers in a predetermined test mode and the second configuration register configures connection between the first and second debug ports and the first and second sets of processor cores, based on the configuration signal.

In another embodiment of the present invention a multi-core integrated circuit is provided. The multi-core integrated circuit includes a plurality of processor cores including first and second sets of processor cores. The first and second sets of processor cores include corresponding first and second sets of test access ports (TAPs), first and second sets of memory blocks, and first and second built-in-self-test (BIST) engines for testing the first and second sets of memory blocks respectively. First and second TAP controllers are connected to the first and second sets of processor cores respectively and connect the corresponding first and second sets of TAPs to corresponding first and second debug ports of the multi-core integrated circuit. The multicore integrated circuit further includes a debug access module. The debug access module includes a fuse storage device and an access control circuit. The fuse storage device stores debug authentication details required to access the first and second debug ports. The access control circuit is connected to the fuse storage device and the first and second debug ports and generates an enable signal to enable at least one of the first and second debug ports by comparing the stored debug authentication details with authentication details received by way of the first and second debug ports. A control circuit is connected between the first and second debug ports and the plurality of processor cores. The control circuit includes first and second configuration registers, and first and second logic gates. The first and second configuration registers receive a configuration signal from at least one of the first and second debug ports. The first configuration register configures the first and second TAP controllers in a predetermined test mode, based on the configuration signal. The first and second logic gates receive the configuration signal from the second configuration register and the enable signal from the access control circuit at respective input terminals and generate a control signal to configure the connection between the first and second debug ports and the first and second sets of processor cores.

Various embodiments of the present invention provide a multi-core integrated circuit that includes a plurality of processor cores that include corresponding memory blocks and built-in-self-test (BIST) engines of different architectures for testing the memory blocks. A control circuit configures TAP controllers corresponding to the processor cores in a predetermined test mode. The control circuit further configures the connection between the first and second debug ports and the first and second sets of processor cores. The predetermined test mode includes connecting the BIST engines in a daisy chain fashion, and concurrent and individual initiation of BIST engines. In the concurrent mode of operation, BIST engines across multiple processor cores can be initiated concurrently to test corresponding memory blocks. The concurrent testing of memory blocks reduces the testing time and cost of the multi-core integrated circuit. The multi-core integrated circuit further includes a debug access module that provides secure access to the debug ports.

Referring now to FIG. 1, a schematic block diagram illustrating a multi-core integrated circuit (IC) 100 in accordance with an embodiment of the present invention is shown. The multi-core IC 100 may be a heterogeneous multi-core IC used in electronic devices including mobile or handheld devices, and small cells (i.e., a wireless base station) such as a femtocell. The multi-core IC 100 includes a plurality of processor cores including first through third sets of processor cores 102*a*-102*c*, a plurality of TAP controllers 104 including first through third TAP controllers 104*a*-104*c*, first and second debug ports 106*a* and 106*b*, a debug mux 108, a debug access module 110, a control circuit 112, a test data input (TDI) demux 114, a test data out (TDO) mux 116, a test mode select (TMS) demux 118, and first and second muxes 120 and 122.

The sets of processor cores 102 may include one or more general purpose processor cores and digital signal processor (DSP) cores, hereinafter referred to as processor cores 102. The first through third processor cores 102*a*-102*c* include corresponding first through third test access ports (TAPs) 126*a*-126*c* (referred to collectively as TAPs 126, first through third memory blocks 128*a*-128*c* (referred to collectively as memory blocks 128), and first through third built-in-self-test (BIST) engines 130*a*-130*c* (referred to collectively as BIST engines 130). In various embodiments of the present invention, the first through third BIST engines 130*a*-130*c* have different architectures. For example, the second BIST engine 130*b* could be formed of two BIST engines, as shown in FIG. 1, for separately testing the memory blocks 128*b* of the core 102*b*.

The BIST engines 130 are accessed by way of the TAPs 126 of the corresponding processor cores 102, i.e., the first TAP 126*a* is configured to access the first processor core 102*a* for initiating the first BIST engine 130*a*, the second TAP 126*b* is configured to access the second processor core 102*b* for initiating the second BIST engine 130*b*, and the third TAP 126*c* is configured to access the third processor core 102*c* for initiating the third BIST engine 130*c*. The BIST engines 130 are configured to test the corresponding memory blocks 128. In various embodiments of the present invention, the TAPs 126 may be any suitable serial/parallel data interfaces and each TAP 126 includes a test data in (TDI) interface, a test data out (TDO) interface, a test clock (TCK) interface, a test mode select (TMS) interface and an optional test reset (TRST) interface.

The TAP controllers 104 are connected between the corresponding first through third TAPs 126*a*-126*c* and the debug ports 106*a* and 106*b* (collectively referred to as debug ports 106) and configure the connections therebetween. Each TAP controller 104 includes a set of data and instruction registers (not shown) that store and process instructions corresponding to various functions thereof.

In various embodiments of the present invention, the debug ports 106 may be IEEE 1149.1 Standard Test Access Port and Boundary-Scan interfaces and each debug port 106 includes a test data in (TDI) interface, a test data out (TDO) interface, a test clock (TCK) interface, a test mode select (TMS) interface and an optional test reset (TRST) interface.

Thus, the first debug port 106*a* includes TDI__1, TDO__1, TCK__1, TMS__1, and TRST__1 interfaces and the second debug port 106*b* includes TDI__2, TDO__2, TCK__2, TMS__2, and TRST__2 interfaces. The debug mux 108 is used to select one or both of the debug ports 106 for testing the multi-core IC 100.

An external testing apparatus may be connected to one or both of the debug ports 106 for initiating the BIST engines 130 of the corresponding processor cores 102. In various embodiments of the present invention, the testing apparatus may be any commercially used testing tool including tools provided by Mentor Graphics™ and the like running software created using CodeWarrior™.

The debug access module 110 includes a fuse storage device 132 and an access control circuit 134 and is connected to the first and second debug ports 106 and the control circuit 112. The fuse storage device 132 stores authentication details required to access the first and second debug ports 106. In various embodiments of the present invention, the stored authentication details may be permanently burnt into the fuse storage device 132 or can be user programmable. The access control circuit 134 is connected to the fuse storage device 132 and the first and second debug ports 106 and is configured to receive authentication details by way of the debug ports 106. The access control circuit 134 compares the received and stored authentication details and generates a permission signal upon valid authentication, which is used to enable access to one or more of the processor cores 102. The permission signal is shown in FIG. 1 as going from the access control circuit 134 to the first TAP 106*a* and indicates that any access made from either 106*a* or 106*b* has to pass through a password protection mechanism. Thus, the debug access module 110 adds a security layer to the multi-core IC 100 and prevents unauthorized access thereto.

The control circuit 112 is connected between the first and second debug ports 106 and the first through third processor cores 102, and includes first and second configuration registers 136 and 138, and first and second AND gates 140 and 142. The first and second configuration registers 136 and 138 receive a configuration signal from the external testing apparatus by way of the debug ports 106. The first configuration register 136 receives the configuration signal and generates first configuration signals (CONFIG_REG__1.0 and CONFIG_REG__1.1) that configure the TAP controllers 104 to a predetermined test mode, by way of the TDI demux 114, the TDO mux 116 and the TMS demux 118.

The second configuration register 138 also receives the configuration signal and generates second configuration signals (CONFIG_REG__2.0 and CONFIG_REG__2.1). The first and second logic gates 140 and 142 receive the CONFIG_REG__2.0 and CONFIG_REG__2.1 signals at corresponding first input terminals and the enable signal at corresponding second input terminals and generate control signals at their output terminals.

FIGS. 2-4 illustrate schematic block diagrams of the TDI demux 114, the TDO mux 116 and the TMS demux 118 of the multi-core IC 100, in accordance with an embodiment of the present invention. The TDI demux 114 is connected between the first and second debug ports 106*a* and 106*b* and the processor cores 102 and includes first through third AND gates 202*a*-202*c*. First input terminals of the first through third AND gates 202*a*-202*c* are connected to TDI interfaces of the first and second debug ports 106*a* and 106*b* and second input terminals thereof are configured to receive the CONFIG_REG__1.1 signal. The second and third AND gates 202*b* and 202*c* receive the CONFIG_REG__1.0 signal at respective third input terminals. Output terminals of the first through third AND gates 202*a*-202*c* are respectively connected to the corresponding TDI interfaces of the processor cores 102 by way of the TAP controllers 104.

Similarly, the TMS demux 118 is connected between the first and second debug ports 106*a* and 106*b* and the processor cores 102, and includes fourth through sixth AND gates 202*d*-202*f*. First input terminals of the fourth through sixth AND gates 202*d*-202*f* are connected to TMS interfaces of the first and second debug ports 106*a* and 106*b*. Second input terminals of the fourth and fifth AND gates 202*d* and 202*e* are configured to receive the CONFIG_REG__1.1 and CONFIG_REG__1.0 signals, respectively.

The CONFIG_REG__1.1 and CONFIG_REG__1.0 signals are provided to a first X-NOR gate 204*a*, and output of the first X-NOR gate 204*a* is provided to a second input terminal of the sixth AND gate 202*f*. Output terminals of the fourth through sixth AND gates 202*d*-202*f* are respectively connected to the corresponding TMS interfaces of the first through third processor cores 102*a*-102*c* by way of the first through third TAP controllers 104*a*-104*c*. In an embodiment of the present invention, the output terminals of the fifth and sixth AND gates 202*e* and 202*f* are connected to first input terminals of third and fourth AND gates 144 and 146. Second input terminals of the third and fourth AND gates 144 and 146 are connected to the output terminals of the first and second AND gates 140 and 142, and receive the control signal. Based on the control signal, the third and fourth AND gates 144 and 146 selectively enable and disable the TMS interfaces of the second and third processor cores 102*b* and 102*c*, respectively.

The TDO mux 116 is connected between the first and second debug ports 106*a* and 106*b* and the processor cores 102, and includes seventh through ninth AND gates 202*g*-202*i*. First input terminals of the seventh through ninth AND gates 202*g*-202*i* are connected to TDO interfaces of the first through third processor cores 102*a*-102*c*, respectively. Second and third input terminals of the seventh and eighth AND gates 202*g* and 202*h* are configured to receive the CONFIG_REG__1.1 and CONFIG_REG__1.0 signals, respectively. The CONFIG_REG__1.1 and CONFIG_REG__1.0 signals are provided to a second X-NOR gate 204*b*, and output of the second X-NOR gate 204*b* is provided to second input terminal of the ninth AND gate 202*i*. Output terminals of the seventh through ninth AND gates 202*g*-202*i* are connected to an input terminal of an OR gate 206 and an output terminal of the OR gate 206 is connected to the TDO interfaces of first and second debug ports 106. It should be understood by a person skilled in the art that the block diagrams of the TDI demux 114, the TDO mux 116 and the TMS demux 118 are illustrative and numerous circuit variations without altering the functionality thereof are possible.

In operation, an external testing apparatus is connected to one or both of the first and second debug ports 106, depending on the predetermined test mode. The external testing apparatus transmits a configuration signal to the first and second configuration registers 136 and 138 based on the predetermined test mode. The first configuration register 136 receives the configuration signal and generates the CONFIG_REG__1.0 and CONFIG_REG__1.1 signals that configure the TDI demux 114, the TDO mux 116 and TMS demux 118, which in turn configure the connection between the debug ports 106 and the processor cores 102. The second configuration register 138 receives the configuration signal and generates the CONFIG_REG__2.0 and CONFIG_REG__2.1 signals that enable the third and fourth AND gates 144 and 146 respectively. In various embodiments of the present invention, configuring the connection between the debug ports 106 and the processor cores 102 includes configuring a connection between the debug ports 106 and the TAP controllers 104 of corresponding processor cores 102.

In a first predetermined test mode, which is a daisy chain mode, the external testing apparatus is connected to the first debug port 106*a*. The external testing apparatus transmits the configuration signal to the first and second configuration registers 136 and 138. The first configuration register 136 generates the CONFIG_REG__1.0 and CONFIG_REG__1.1 signals, which configure the TDI demux 114, the TDO mux 116, and the TMS demux 118. The second configuration register 138 generates the second configuration signals CONFIG_REG__2.0 and CONFIG_REG__2.1, which configure the third and fourth AND gates 144 and 146, respectively.

The enable signal and the CONFIG_REG__2.0 and CONFIG_REG__2.1 signals enable the first through third processor cores 102. The TDI interface of the first processor core 102*a* is connected to one or both of the TDI__1 and TDI__2 interfaces by way of the TDI demux 114. The TDO interface of the first processor core 102*a* is connected to the TDI interface of the second processor core 102*b* by way of the first multiplexer 120 and the TDO interface of the second processor core 102*b* is connected to the TDI interface of the third processor core 102*c* by way of the second multiplexer 122. The TDO interface of the third processor core 102*c* is connected to one or both of the TDO__1 and TDO__2 interfaces by way of the TDO mux 116. The external testing apparatus provides input data at the TDI__1/TDI__2 interface and initiates the first BIST engine 130*a* by way of the TDI interface of the first processor core 102*a*. The output test data at the TDO interface of the first processor core 102*a* is provided as an input to the second processor core 102*b* by way of the TDI interface thereof, thereby initiating the second BIST engine 130*b*. Similarly, the output test data at the TDO interface of the second processor core 102*b* is provided as an input to the third processor core 102*c* by way of the TDI interface thereof, thereby initiating the third BIST engine 130*c*. Thus, the BIST engines 130 are programmed concurrently and when the testing starts, the BIST engines 130*a*-130*c* operate in daisy chain mode and BIST status thereof is received at TDO__1/TDO__2 interface or tapped at an output pad (not shown) of the multi-core IC 100. Thus, the first through third BIST engines 130*a*-130*c* are connected in a daisy chain mode for testing the corresponding first through third memory blocks 128*a*-128*c*. Though the daisy chain mode has been described by using first through third BIST engines 130*a*-130*c* as an example, it will be apparent to a person skilled in the art that any two BIST engines 130 (for example, first and second BIST engines 130*a* and 130*b*, second and third BIST engines 130*b* and 130*c*, and first and third BIST engines 130*a* and 130*c*) may also be connected in a daisy chain mode for testing the corresponding memory blocks 128.

In a second predetermined test mode, concurrent mode, the external testing apparatus is connected to the first debug port 106*a*. The external testing apparatus transmits the configuration signal to the first and second configuration registers 136 and 138. The first configuration register 136 generates the CONFIG_REG__1.0 and CONFIG_REG__1.1 signals that configure the TDI demux 114, the TDO mux 116, and the TMS demux 118. The second configuration register 138 generates the second configuration signals CONFIG_REG__2.0 and CONFIG_REG__2.1 that configure the third and fourth AND gates 144 and 146, respectively.

The enable signal and the CONFIG_REG__2.0 and CONFIG_REG__2.1 signals enable the first through third processor cores 102. The TDI interfaces of the first through third processor cores 102 are connected concurrently or substantially simultaneously to one or both of the TDI__1 and TDI__2 interfaces by way of the TDI demux 114. The TDO interfaces of the first through third processor cores 102*a*-102*c* are connected to one or both of the TDO__1 and TDO__2 interfaces by way of the TDO mux 116. The external testing apparatus provides input data at the TDI__1/TDI__2 interface, which initiates the first through third BIST engines 130*a*-130*c* simultaneously by way of the TDI interfaces of the first through third processor cores 102*a*-102*c*. The output data at the TDO interface of the first through third processor cores 102*a*-102*c* is received in parallel at the TDO__1/TDO__2 interface and tapped at the input/output (I/O) pad of the multi-core IC 100. Thus, the first through third BIST engines 130*a*-130*c* are initiated concurrently for testing the corresponding first through third memory blocks 128*a*-128*c*. Though the concurrent mode has been described for initiating the first through third BIST engines 130*a*-130*c* concurrently, it will be apparent to a person skilled in the art that any two BIST engines (for example, first and second BIST engines 130*a* and 130*b*, or second and third BIST engines 130*b* and 130*c*) may be initiated concurrently for testing corresponding memory blocks 128.

In a third predetermined test mode, individual mode, the external testing apparatus is connected to the first debug port 106*a*. The external testing apparatus transmits the configuration signal to the first and second configuration registers 136 and 138. The first configuration register 136 generates the CONFIG_REG__1.0 and CONFIG_REG__1.1 signals that configure the TDI demux 114, the TDO mux 116, and the TMS demux 118. The second configuration register 138 generates the second configuration signals CONFIG_REG__2.0 and CONFIG_REG__2.1 that configure the third and fourth AND gates 144 and 146, respectively.

For initiating the first BIST engine 130*a*, the enable signal and the CONFIG_REG__2.0 and CONFIG_REG__2.1 signals enable the first processor core 102*a* and disable the second and third processor cores 102*b* and 102*c*. The TDI interface of the first processor core 102*a* is connected to one or both of the TDI__1 and TDI__2 interfaces by way of the TDI demux 114. The TDO interface of the first processor core 102*a* is connected to one or both of the TDO__1 and TDO__2 interfaces by way of the TDO mux 116. The external testing apparatus provides input data at the TDI__1/TDI__2 interface and initiates the first BIST engine 130*a* by way of the TDI interface of the first processor core 102*a*. The output data at the TDO interface of the first processor core 102*a* is received at the TDO__1/TDO__2 interface and tapped at the I/O pad of the multi-core IC 100. Thus, only the first BIST engine 130*a* is initiated for testing the first memory block 128*a*. Similarly, the second and third BIST engines 130*b* and 130*c* may be initiated individually for testing corresponding second and third memory blocks 128*b* and 128*c*.

In various embodiments of the present invention, the control circuit 112 may include a STATUS register (not shown) that latches test completion status of the first through third BIST engines 130*a*-130*c* and can be read from one of the first and second debug ports 106*a* and 106*b*. The test completion status of the first through third BIST engines 130*a*-130*c* can also be observed on I/O pads of the multi-core IC 100.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A multi-core integrated circuit, comprising:

a plurality of processor cores including first and second sets of processor cores, wherein the first and second sets of processor cores include:

corresponding first and second sets of test access ports (TAPs);

corresponding first and second sets of memory blocks; and corresponding first and second built-in-self-test (BIST) engines for testing the first and second sets of memory blocks, respectively;

first and second TAP controllers connected to the first and second sets of processor cores respectively, and wherein the first and second TAP controllers connect the corresponding first and second sets of TAPs to corresponding first and second debug ports of the multi-core integrated circuit; and a control circuit, connected to the first and second debug ports and the plurality of processor cores, wherein the control circuit includes first and second configuration registers for receiving a configuration signal from at least one of the first and second debug ports, and wherein the first configuration register configures the first and second TAP controllers in a predetermined test mode and the second configuration register configures connection between the first and second debug ports and the first and second sets of processor cores.

2. The multi-core integrated circuit of claim 1, further comprising a debug access module, wherein the debug access module includes:

a fuse storage device for storing debug authentication details required to access the first and second debug ports; and an access control circuit, connected to the fuse storage device and the first and second debug ports, wherein the access control unit generates an enable signal to enable at least one of the first and second debug ports by comparing authentication details received by way of the first and second debug ports and the stored debug authentication details.

3. The multi-core integrated circuit of claim 2, wherein the control circuit further comprises first and second logic gates that receive the configuration signal from the second configuration register, and the enable signal from the access control circuit, at respective input terminals and generate a control signal to configure the connection between the first and second debug ports and the first and second sets of processor cores.

4. The multi-core integrated circuit of claim 3, wherein the first and second debug ports each comprise a test data in (TDI) interface, a test data out (TDO) interface, a test clock (TCK) interface, a test mode select (TMS) interface and an optional test reset (TRST) interface.

5. The multi-core integrated circuit of claim 4, further comprising a TDI de-multiplexer connected between the first and second debug ports, and the first and second sets of processor cores, for configuring the connection between TDI interfaces of the first and second debug ports and the first and second sets of processor cores.

6. The multi-core integrated circuit of claim 5, further comprising a TDO multiplexer connected between the first and second debug ports, and the first and second sets of processor cores, for configuring the connection between TDO interfaces of the first and second debug ports and the first and second sets of processor cores.

7. The multi-core integrated circuit of claim 6, further comprising a TMS de-multiplexer connected between the first and second debug ports, and the first and second sets of processor cores, for configuring the connection between TMS interfaces of the first and second debug ports and the first and second sets of processor cores.

8. The multi-core integrated circuit of claim 7, further comprising third and fourth logic gates connected between the TMS de-multiplexer, the first and second logic gates, and the first and second sets of processor cores, respectively, for configuring the connection between the first and second debug ports and the first and second sets of processor cores, based on the control signal.

9. The multi-core integrated circuit of claim 8, wherein the first predetermined test mode comprises connecting the first and second BIST engines in a daisy chain mode for initiating the first and the second BIST engines concurrently, by configuring the first configuration register by way of the configuration signal.

10. The multi-core integrated circuit of claim 8, wherein the first predetermined test mode comprises initiating the first and second BIST engines in parallel, by configuring the first configuration register by way of the configuration signal.

11. The multi-core integrated circuit of claim 8, wherein the first predetermined test mode comprises initiating the first and second BIST engines independently, by configuring the first configuration register by way of the configuration signal.

12. A multi-core integrated circuit, comprising:

a plurality of processor cores including first and second sets of processor cores, wherein the first and second sets of processor cores include:

corresponding first and second sets of test access ports (TAPs);

corresponding first and second sets of memory blocks; and corresponding first and second built-in-self-test (BIST) engines for testing the first and second sets of memory blocks, respectively;

first and second TAP controllers connected to the first and second sets of processor cores respectively, and wherein the first and second TAP controllers connect the corresponding first and second sets of TAPs to corresponding first and second debug ports of the multi-core integrated circuit;

a debug access module, including:

a fuse storage device for storing debug authentication details required to access the first and second debug ports; and an access control circuit, connected to the fuse storage device and the first and second debug ports, wherein the access control unit generates an enable signal to enable at least one of the first and second debug ports by comparing authentication details received by way of the first and second debug ports and the stored debug authentication details; and a control circuit, connected to the first and second debug ports and the plurality of processor cores, wherein the control circuit includes:

a first configuration register that receives a configuration signal from at least one of the first and second debug ports and configures the first and second TAP controllers in a predetermined test mode;

a second configuration register that receives the configuration signal; and first and second logic gates that receive the configuration signal from the second configuration register, and the enable signal from the access control circuit, at respective input terminals, and generate a control signal to configure the connection between the first and second debug ports and the first and second sets of processor cores.

13. The multi-core integrated circuit of claim 12, wherein the first and second debug ports each comprise a test data in (TDI) interface, a test data out (TDO) interface, a test clock (TCK) interface, a test mode select (TMK) interface and an optional test reset (TRST) interface.

14. The multi-core integrated circuit of claim 13, further comprising a TDI de-multiplexer connected between the first and second debug ports, and the first and second sets of processor cores, for configuring the connection between TDI interfaces of the first and second debug ports and the first and second sets of processor cores.

15. The multi-core integrated circuit of claim 14, further comprising a TDO multiplexer connected between the first and second debug ports, and the first and second sets of processor cores, for configuring the connection between TDO interfaces of the first and second debug ports and the first and second sets of processor cores.

16. The multi-core integrated circuit of claim 15, further comprising a TMS de-multiplexer connected between the first and second debug ports, and the first and second sets of processor cores, for configuring the connection between TMS interfaces of the first and second debug ports and the first and second sets of processor cores.

17. The multi-core integrated circuit of claim 16, further comprising third and fourth logic gates connected between the TMS de-multiplexer, the first and second logic gates, and the first and second sets of processor cores, respectively, for configuring the connection between the first and second debug ports and the first and second sets of processor cores, based on the control signal.

18. The multi-core integrated circuit of claim 17, wherein the first predetermined test mode comprises connecting the first and second BIST engines in a daisy chain mode for initiating the first and the second BIST engines concurrently, by configuring the first configuration register by way of the configuration signal.

19. The multi-core integrated circuit of claim 17, wherein the first predetermined test mode comprises initiating the first and second BIST engines in parallel, by configuring the first configuration register by way of the configuration signal.

20. The multi-core integrated circuit of claim 17, wherein the first predetermined test mode comprises initiating the first and second BIST engines independently, by configuring the first configuration register by way of the configuration signal.

* * * * *